United States Patent
Lee et al.

(10) Patent No.: US 10,034,376 B2
(45) Date of Patent: Jul. 24, 2018

(54) INTERNAL/EXTERNAL CIRCUIT BOARD CONNECTION STRUCTURE

(71) Applicants: LITE-ON ELECTRONICS (GUANGZHOU) LIMITED, Guangzhou (CN); Lite-On Technology Corporation, Taipei (TW)

(72) Inventors: Yi-Hsun Lee, Taipei (TW); Chun-Lung Ho, Taipei (TW); Wu-Chen Lin, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 12 days.

(21) Appl. No.: 15/264,613

(22) Filed: Sep. 14, 2016

(65) Prior Publication Data

US 2018/0054893 A1 Feb. 22, 2018

(30) Foreign Application Priority Data

Aug. 16, 2016 (CN) .......................... 2016 1 0674438

(51) Int. Cl.
*H05K 1/14* (2006.01)
*H05K 1/11* (2006.01)

(52) U.S. Cl.
CPC ............. *H05K 1/142* (2013.01); *H05K 1/111* (2013.01); *H05K 2201/048* (2013.01); *H05K 2201/094* (2013.01); *H05K 2201/09727* (2013.01)

(58) Field of Classification Search
None
See application file for complete search history.

(56) References Cited

U.S. PATENT DOCUMENTS

| 3,777,221 | A | * | 12/1973 | Tatusko | .............. H01L 23/5384 174/261 |
| 4,549,200 | A | * | 10/1985 | Ecker | .................. H01L 23/4006 174/252 |
| 4,551,746 | A | * | 11/1985 | Gilbert | .................. H01L 23/057 257/691 |
| 4,763,409 | A | * | 8/1988 | Takekawa | ........... H01L 21/4839 174/551 |
| 4,802,062 | A | * | 1/1989 | Blum | .................... H01L 23/147 257/E23.008 |
| 4,838,798 | A | * | 6/1989 | Evans | ................ H01R 12/7082 439/493 |

(Continued)

FOREIGN PATENT DOCUMENTS

TW     M322127     11/2007

OTHER PUBLICATIONS

"Office Action of Taiwan Counterpart Application," dated Jun. 22, 2017, p. 1-p. 4.

*Primary Examiner* — Dimary Lopez Cruz
*Assistant Examiner* — Muhammed Azam
(74) *Attorney, Agent, or Firm* — JCIPRNET

(57) ABSTRACT

A circuit board structure includes a first circuit board, a second circuit board and a plurality of first connection portions. The first circuit board has a first opening, and the second circuit board is disposed inside the first opening of the first circuit board. The first circuit board and the second circuit board are electrically independent from each other. The first connection portions are connected to the first circuit board and the second circuit board.

7 Claims, 5 Drawing Sheets

(56) References Cited

U.S. PATENT DOCUMENTS

| | | | | |
|---|---|---|---|---|
| 5,067,042 A * | 11/1991 | Nagano | H05K 1/111 | 361/774 |
| 5,093,985 A * | 3/1992 | Houldsworth | H05K 1/148 | 29/622 |
| 5,260,854 A * | 11/1993 | Hileman | H05K 7/142 | 361/736 |
| 5,335,146 A * | 8/1994 | Stucke | H05K 1/14 | 174/260 |
| 5,544,174 A * | 8/1996 | Abend | G01R 31/2815 | 714/32 |
| 5,663,871 A * | 9/1997 | Bayani | H05K 1/144 | 361/728 |
| 5,835,358 A * | 11/1998 | Brakus | H02M 3/00 | 174/255 |
| 5,898,128 A * | 4/1999 | Romero | H01L 23/5389 | 174/534 |
| 6,000,125 A * | 12/1999 | Kang | H01L 23/367 | 257/719 |
| 6,320,756 B1 * | 11/2001 | Ikeda | H05K 1/142 | 361/760 |
| 6,385,053 B1 * | 5/2002 | Parizi | H05K 7/1418 | 361/724 |
| 6,559,665 B1 * | 5/2003 | Barabi | G01R 1/0483 | 257/E23.078 |
| 6,765,800 B2 * | 7/2004 | Haba | G06F 13/409 | 174/129 B |
| 6,777,798 B2 * | 8/2004 | Fukumoto | H01L 25/105 | 257/686 |
| 6,882,538 B1 * | 4/2005 | Frisch | H01L 25/162 | 174/252 |
| 7,008,236 B2 * | 3/2006 | Wabiszczewicz | H05K 1/141 | 29/402.08 |
| 7,102,892 B2 * | 9/2006 | Kledzik | H01L 25/0652 | 257/686 |
| 7,361,844 B2 * | 4/2008 | Vinciarelli | H05K 1/141 | 174/252 |
| 7,405,471 B2 * | 7/2008 | Kledzik | H05K 1/141 | 257/686 |
| 7,435,097 B2 * | 10/2008 | Mecker | G11C 5/04 | 174/260 |
| 2002/0012239 A1 * | 1/2002 | Dent | H05K 1/142 | 361/803 |
| 2002/0054486 A1 * | 5/2002 | Miyajima | H05K 1/141 | 361/803 |
| 2002/0071259 A1 * | 6/2002 | Roos | H05K 3/366 | 361/784 |
| 2003/0000734 A1 * | 1/2003 | Nakagawa | H01L 23/544 | 174/250 |
| 2005/0128692 A1 * | 6/2005 | Schmitt | H01L 25/50 | 361/679.01 |
| 2005/0231925 A1 * | 10/2005 | Fukuda | H01L 21/565 | 361/760 |
| 2005/0272276 A1 * | 12/2005 | Ooyabu | H05K 1/142 | 439/35 |
| 2008/0099235 A1 * | 5/2008 | Hiramoto | H01L 23/49816 | 174/261 |
| 2008/0264192 A1 * | 10/2008 | Christensen | H05K 1/142 | 74/469 |
| 2009/0159182 A1 * | 6/2009 | Lammlein, Jr. | B29C 66/83411 | 156/110.1 |
| 2010/0139967 A1 * | 6/2010 | Takahashi | H05K 1/142 | 174/262 |
| 2010/0177490 A1 * | 7/2010 | Gibbons | H01L 25/0657 | 361/764 |
| 2014/0022752 A1 * | 1/2014 | Wille | H05K 1/142 | 361/792 |
| 2016/0179135 A1 * | 6/2016 | Kumagai | H05K 1/142 | 361/679.31 |

* cited by examiner

INTERNAL/EXTERNAL CIRCUIT BOARD CONNECTION STRUCTURE

CROSS-REFERENCE TO RELATED APPLICATION

This application claims the priority benefit of China application no. 201610674438.7, filed on Aug. 16, 2016. The entirety of the above-mentioned patent application is hereby incorporated by reference herein and made a part of this specification.

BACKGROUND

Field of the Invention

The invention is directed to a circuit board structure and more particularly, to a circuit board with preferable economic efficiency.

Description of Related Art

Generally, a shape and device configuration of a circuit board of an electronic apparatus has to be adaptively adjusted according to a containing space planned for the electron apparatus in compliance with safety regulations. In other words, when the containing space of the electronic apparatus is limited, or in order to comply with the safety regulations, a designer needs to perform an operation, such as chamfering, punching or holing, on the circuit board, and thus, there are waste materials generated. Therefore, it is an important object to provide the circuit board for reducing the generation of the waste materials to conform to the recent environmental awareness and meet economic efficiency.

SUMMARY

The invention provides a circuit board structure capable of effectively reducing generation of waste of circuit boards and having better economic efficiency.

A circuit board structure of the invention includes a first circuit board, a second circuit board and a plurality of first connection portions. The first circuit board has a first opening, and the second circuit board is disposed inside the first opening of the first circuit board. The first circuit board and the second circuit board are electrically independent from each other. The first connection portions are connected to the first circuit board and the second circuit board.

In an embodiment of the invention, the circuit board structure further includes: a mainboard and a plurality of second connection portions. The mainboard has a second opening, and the first circuit board and the second circuit board are disposed inside the second opening. The second connection portions are connected to the mainboard and the first circuit board.

In an embodiment of the invention, the mainboard, the first circuit board and the second circuit board are located on a same plane.

In an embodiment of the invention, the first circuit board includes a plurality of first pads separated from one another, and the second circuit board includes a plurality of second pads separated from one another. The first pads are located on a first side surface of the first circuit board relatively far away from the second circuit board, and the second pads are located on a second side surface of the second circuit board relatively adjacent to the first circuit board.

In an embodiment of the invention, the first connection portions and the second pads are misaligned, and the second connection portions and the first pads are misaligned.

In an embodiment of the invention, the first circuit board further includes a plurality of first lines, and the second circuit board further includes a plurality of second lines. The first lines are connected to part of the first pads, and the second lines are connected to part of the second pads.

In an embodiment of the invention, the circuit board structure further includes: an insulation layer at least disposed on the first circuit board, the second circuit board and the first connection portions. The insulation layer at least covers the first lines, the second lines and the first connection portions and exposes the first pads and the second pads.

In an embodiment of the invention, the insulation layer further covers a first outer surface of each of the first pads.

In an embodiment of the invention, the insulation layer further covers a second outer surface of each of the second pads.

In an embodiment of the invention, contour outlines of the first circuit board and the second circuit board include a circular or a polygon shape.

To sum up, the circuit board structure of the invention has the first circuit board and the second circuit board that are electrically independent from each other, and the second circuit board is disposed inside the first opening of the first circuit board. Namely, in the invention, a waste region (i.e., the first opening) of the first circuit board is sufficiently utilized and planned to serve as the second circuit board. Thereby, in the circuit board structure of the invention, the generation of waste materials and product material cost can be effectively reduced, and the first circuit board can be sufficiently utilized to achieve the preferable economic efficiency.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
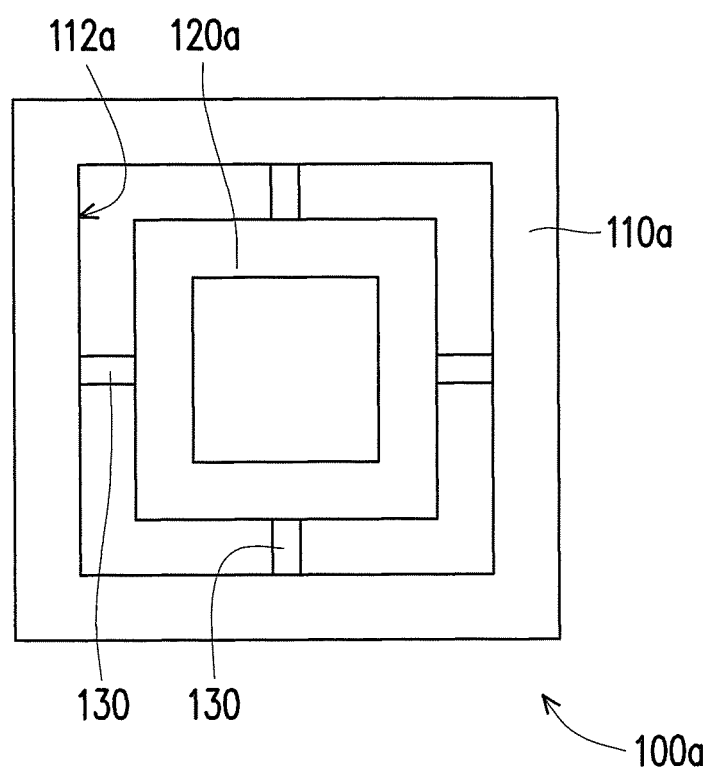
FIG. 1 is a schematic top view illustrating a circuit board structure according to an embodiment of the invention.

FIG. 1 is a schematic top view illustrating a circuit board structure according to an embodiment of the invention. Referring to FIG. 1, in the present embodiment, a circuit board structure 100a includes a first circuit board 110a, a second circuit board 120a and a plurality of first connection portions 130. The first circuit board 110a has a first opening 112a, and the second circuit board 120a is disposed inside the first opening 112a of the first circuit board 110a. The first connection portions 130 are connected to the first circuit board 110a and the second circuit board 120a. The first circuit board 110a and the second circuit board 120a are electrically independent from each other. Namely, the lines or circuits formed on the first circuit boards 110a are not electrically connected to the lines or circuits formed on the second circuit boards 120a.

Specifically, as illustrated in FIG. 1, contour outlines of the first circuit board 110a and the second circuit board 120a of the present embodiment include a polygon shape, e.g., a square shape, but the invention is not limited thereto. The second circuit board 120a is disposed inside the first opening 112a of the first circuit board 110a, and the first circuit board 110a and the second circuit board 120a are arranged concentrically. As for the structure, the first circuit board 110a and the second circuit board 120a are separated from each other and structurally connected together through the first connection portions 130. As for electricity characteristics, the first circuit board 110a and the second circuit board 120a are electrically independent from each other. In other words, the lines or circuits formed on the first circuit boards 110a are configured to electrically isolate from the lines or circuits formed on the second circuit boards 120a.

The circuit board structure 100a of the present embodiment has the first circuit board 110a and the second circuit board 120a that are electrically independent from each other, and the second circuit board 120a is disposed inside the first opening 112a of the first circuit board 110a. Namely, a waste region (i.e., the first opening 112a) of the first circuit board 110a is sufficiently utilized and planned to serve as the second circuit board 120a in the present embodiment. Thereby, in the circuit board structure 100a of the present embodiment, the generation of waste materials and product material cost can be effectively reduced, and the first circuit board 110a can be sufficiently utilized to achieve the preferable economic efficiency.

It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 2A:
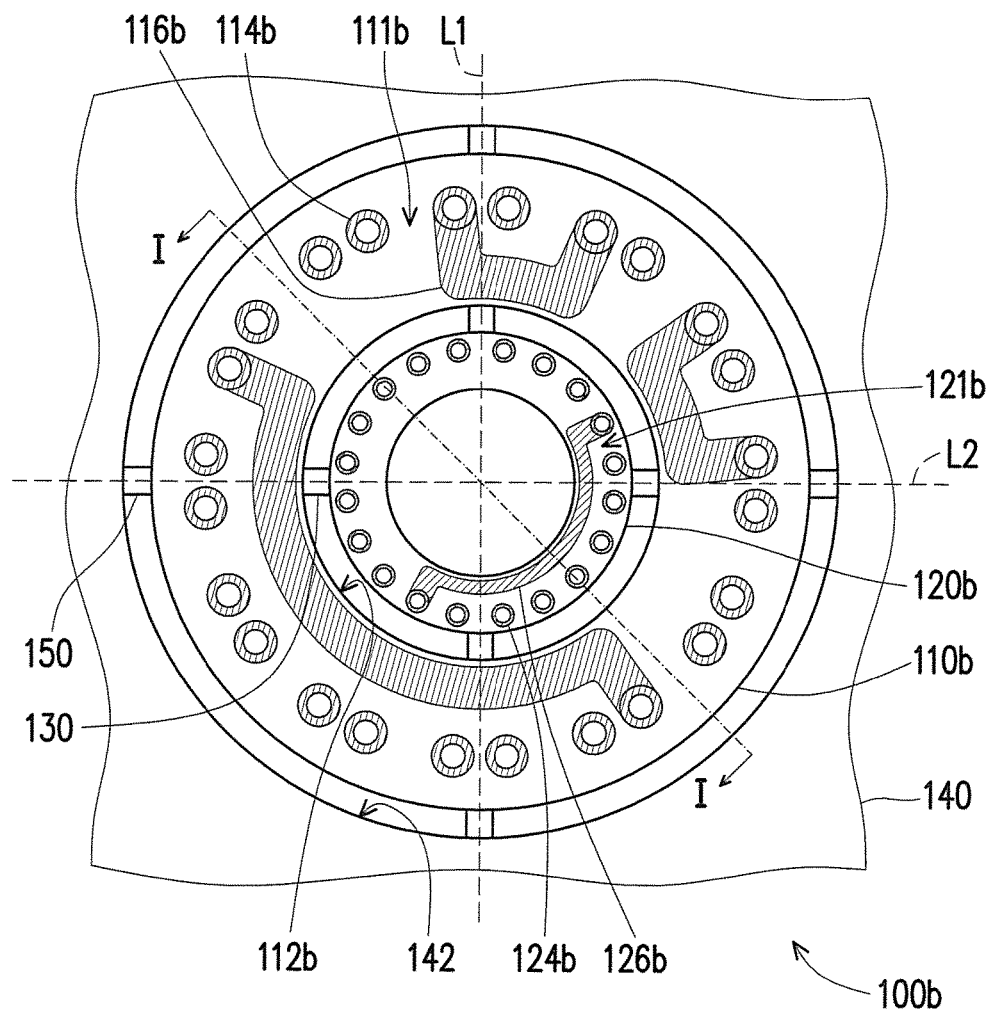
FIG. 2A is a schematic top view illustrating a circuit board structure according to another embodiment of the invention.
Figure 2B:
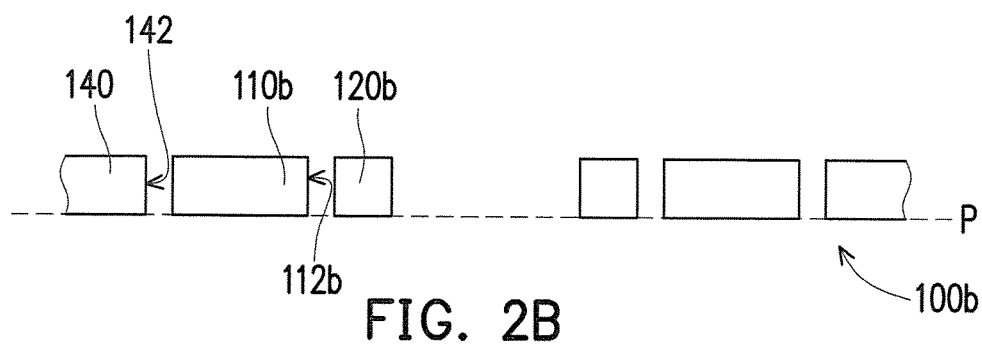
FIG. 2B is a schematic cross-sectional view taken along line I-I in FIG. 2A.

FIG. 2A is a schematic top view illustrating a circuit board structure according to another embodiment of the invention. FIG. 2B is a schematic cross-sectional view taken along line I-I in FIG. 2A. Referring to both FIG. 1 and FIG. 2A, a circuit board structure 100b of the present embodiment is similar to the circuit board structure 100a illustrated in FIG. 1, and a difference therebetween lies in: the circuit board structure 100b of the present embodiment further including a mainboard 140 and a plurality of second connection portions 150. The mainboard 140 has a second opening 142, and a first circuit board 110b and a second circuit board 120b are disposed inside the second opening 142. The second connection portions 150 are connected to the mainboard 140 and the first circuit board 110b. Additionally, both the first circuit board 110b and the second circuit board 120b of the present embodiment have a circular contour outline.

Specifically, referring to FIG. 2B, the mainboard 140, the first circuit board 110b and the second circuit board 120b are substantially located on a same plane P. Actually, the mainboard 140, the first circuit board 110b and the second circuit board 120b pertain to a multi-film stack structure layer formed by the same materials and the same manufacturing process. In the present embodiment, the first circuit board 110b and the second circuit board 120b are concentrically arranged in the second opening 142 of the mainboard 140. A diameter of the first circuit board 110b is greater than a diameter of the second circuit board 120b, and the second circuit board 120b is disposed inside a first opening 112b of the first circuit board 110b. In an application scenario, the first circuit board 110b with the greater diameter is adapted to serve as a driving circuit board for a motor with a high wattage (e.g., 1 KW), and the second circuit board 110b with the smaller diameter is adapted to serve as a drive circuit board for a motor with a low wattage (e.g., 750 W), but the invention is not limited thereto.

Furthermore, referring to FIG. 2A again, the first circuit board 110b of the present embodiment includes a plurality of first pads 114b separated from one another, and the second circuit board 120b includes a plurality of second pads 124b separated from one another. The first pads 114b are located on a first side surface 111b of the first circuit board 110b relatively far away from the second circuit board 120b, and the second pads 124b are located on a second side surface 121b of the second circuit board 120b relatively adjacent to the first circuit board 110b. Specially, in the present embodiment, the first connection portions 130 and the second pads 124b are misaligned, and the second connection portions 150 and the first pads 114b are misaligned, such that the structures of the first pads 114b and the second pads 124b can be prevented from being damaged when a punching process is subsequently performed on the first connection portions 130 and the second connection portions 150. Referring to FIG. 2A, in the present embodiment, part of the first connection portions 130 and part of the second connection portions 150 are located on the same extension line L1, and another part of the first connection portions 130 and another part of the second connection portions 150 are located on the same extension line L2, but the invention is not limited thereto. In other embodiments that are not shown, the first connection portions 130 and the second connection portions 150 may also not be located on the same extension line L1 or L2, and the first connection portions 130 and the second connection portions 150, as long as being respectively misaligned with the first pads 114b and the second pads 124b, fall within the scope sought to protect by the invention.

Additionally, the first circuit board 110b of the present embodiment further includes a plurality of first lines 116b, and the second circuit board 120b further includes a plurality of second lines 126b. The first lines 116b are connected to part of the first pads 114b, and the second lines 126b are connected to part of the first pads 124b. In this circumstance, the first circuit board 110b may be electrically connected to a first external circuit (not shown) through the first pads 114b and the second circuit board 120b may be electrically connected to a second external circuit (not shown) through the second pads 124b for electric signal transmission.

Briefly speaking, in the circuit board structure 100b of the present embodiment, at least the first circuit board 110b and the second circuit board 120b which are electrically independent from each other are disposed inside the second opening 142 of the mainboard 140, and the second circuit board 120b is disposed inside the first opening 112b of the first circuit board 110b. Namely, a waste region (i.e., the first opening 112b) of the first circuit board 110b is sufficiently utilized and planned to serve as the second circuit board 120b in the present embodiment. Thereby, in the circuit board structure 100b of the present embodiment, the generation of waste materials and product material cost can be effectively reduced, and the first circuit board 110b can be sufficiently utilized to achieve the preferable economic efficiency.

Figure 3:
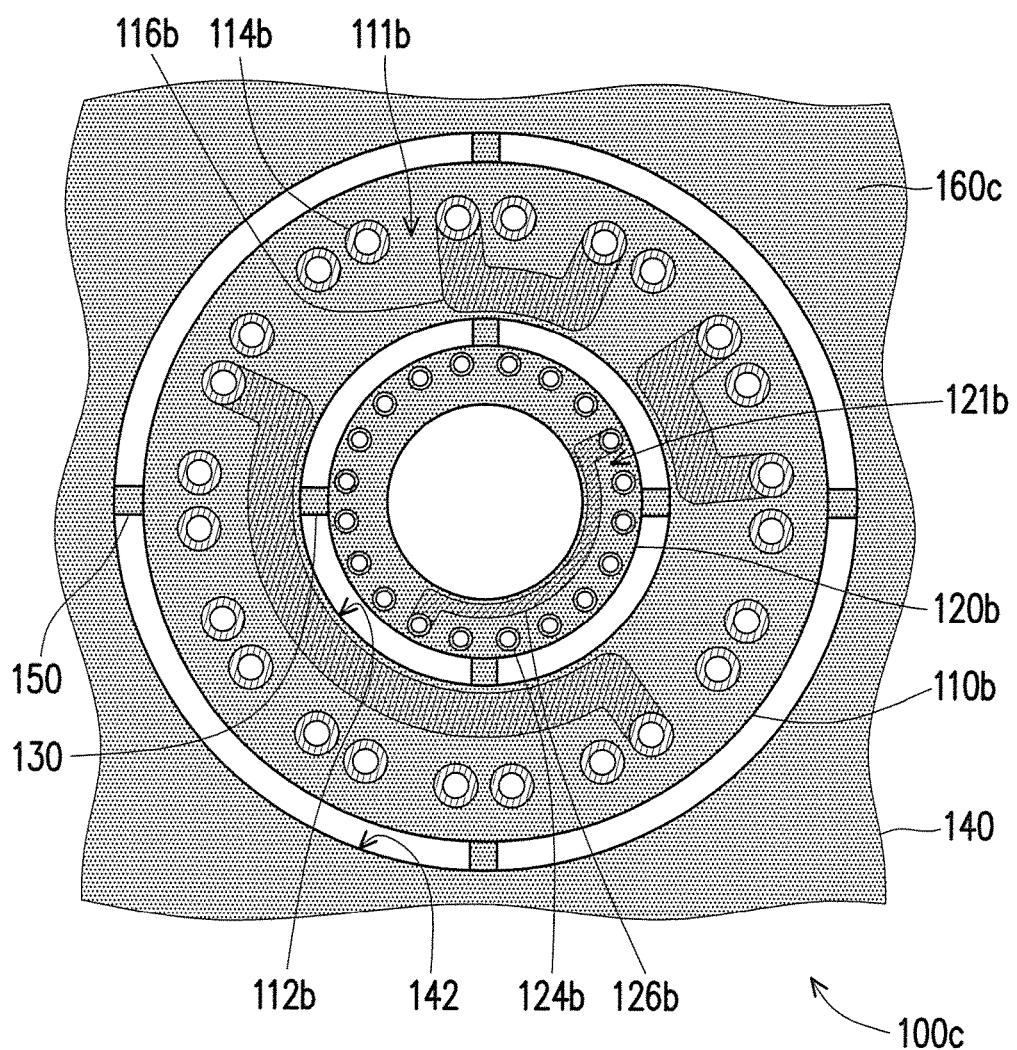
FIG. 3 is a schematic top view illustrating a circuit board structure according to another embodiment of the invention.

FIG. 3 is a schematic top view illustrating a circuit board structure according to another embodiment of the invention. Referring to both FIG. 2A and FIG. 3, a circuit board structure 100c of the present embodiment is similar to the circuit board structure 100b illustrated in FIG. 2A, and a difference therebetween lies in: the circuit board structure 100c of the present embodiment further including an insulation layer 160c at least disposed on the first circuit board 110b, the second circuit board 120b and the first connection portions 130. The insulation layer 160c at least covers the first lines 116b, the second lines 126b and the first connection portions 130 and exposes the first pads 114b and the second pads 124b. Referring to FIG. 3, the insulation layer 160c is further disposed on the mainboard 140 and the second connection portions 150 and covers the mainboard 140 and the second connection portions 150.

In the present embodiment, the circuit board structure 100c is disposed with the insulation layer 160c, such that the first lines 116b and the second lines 126b on the first circuit board 110b and the second circuit board 120b can be protected, and the first pads 114b and the second pads 124b exposed by the insulation layer 160c serve for being connected with an external circuit (not shown). Certainly, the invention is not intent to limit the configuration relation of the insulation layer 160c.

Figure 4:
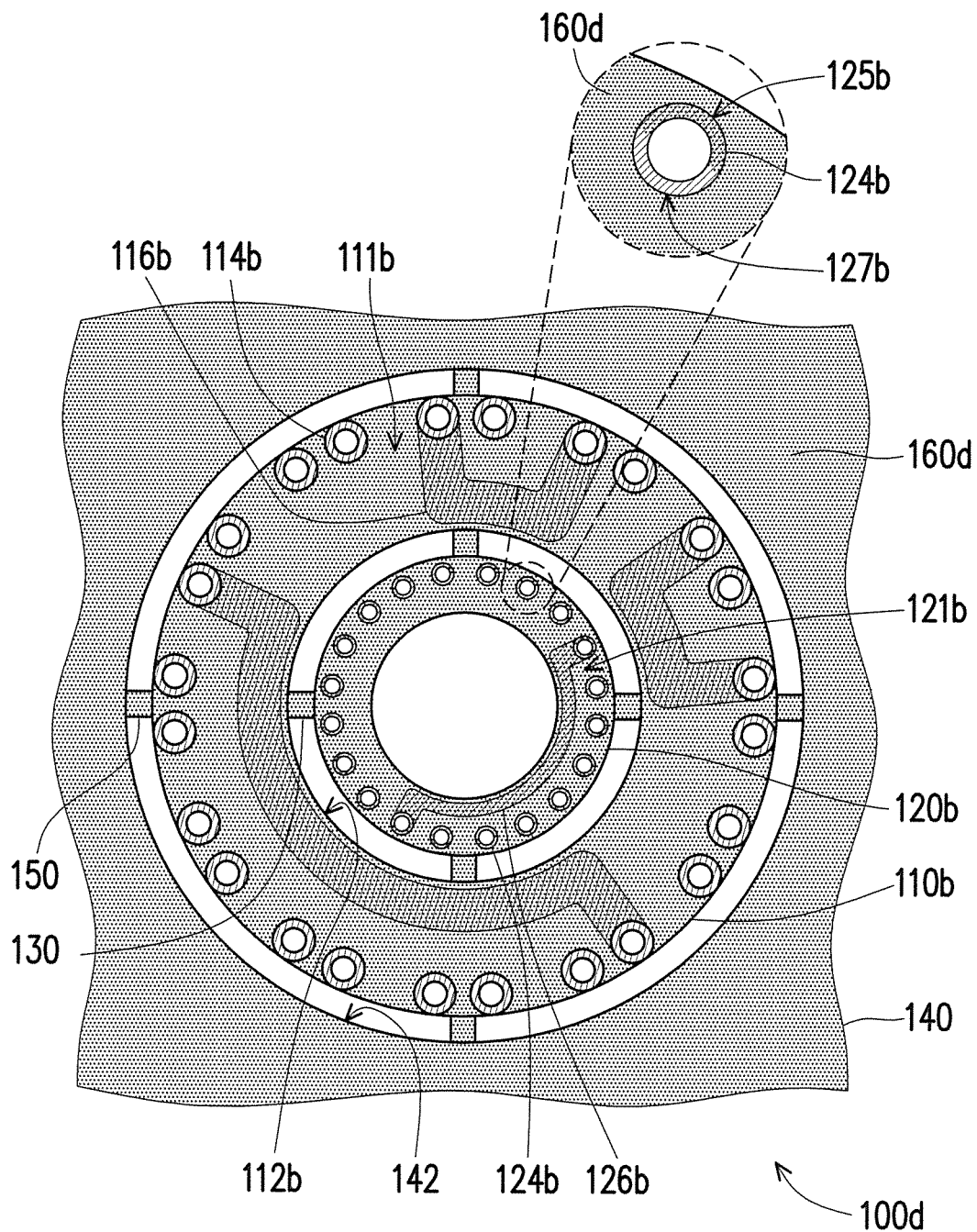
FIG. 4 is a schematic top view illustrating a circuit board structure according to another embodiment of the invention.
Figure 5:
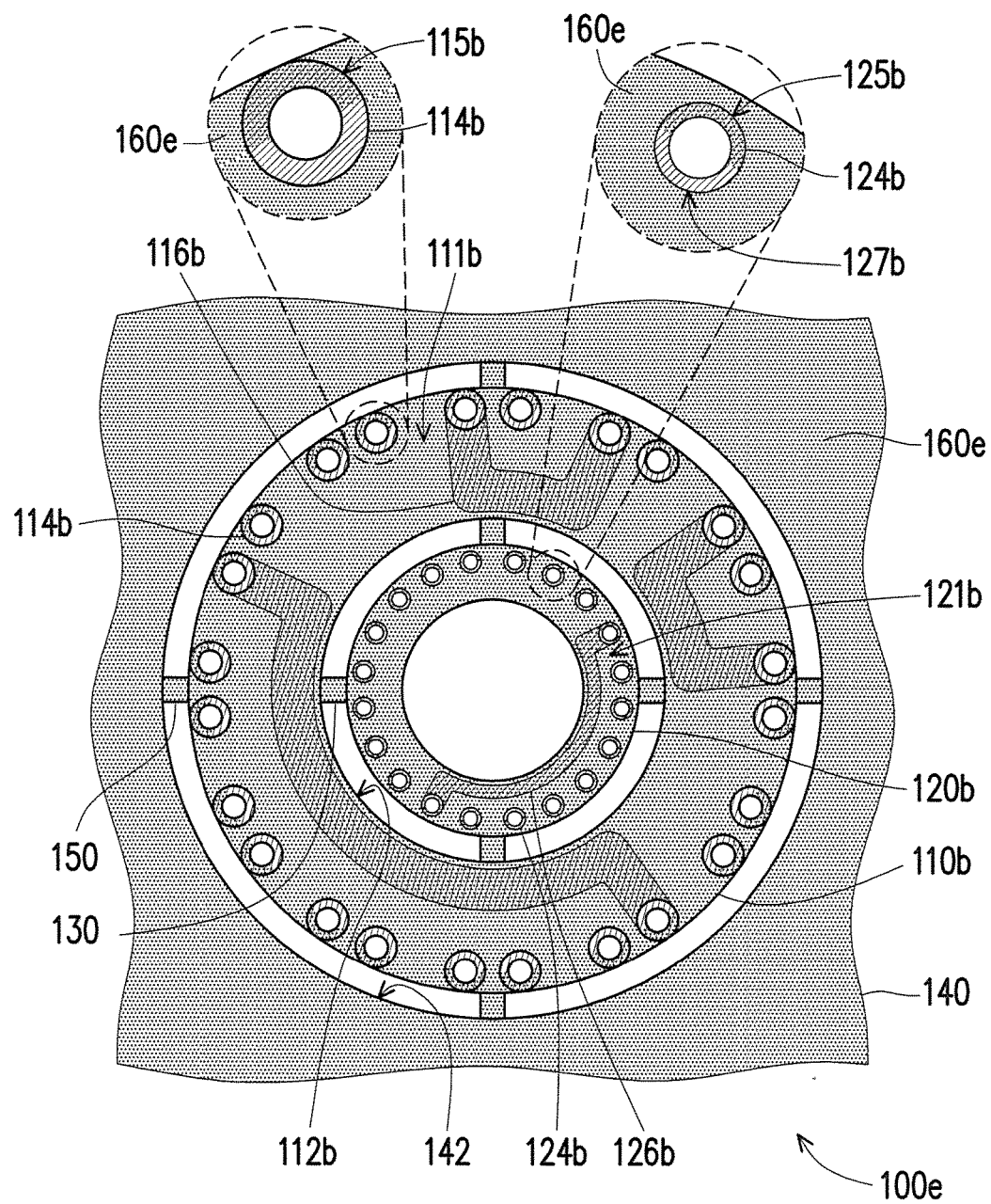
FIG. 5 is a schematic top view illustrating a circuit board structure according to another embodiment of the invention.

In other embodiments, referring to FIG. 4, an insulation layer 160d of a circuit board structure 100d may further cover a second outer surface 125b of each second pad 124b on the second circuit board 120b, so as to prevent the second pads 124b and other devices (e.g., a motor) from failing to meet safety regulation requirements due to a short circuit occurs thereto during a subsequent high pressure testing process. In other words, the second outer surface 125b of each second pad 124b is covered by the insulation layer 160d, and a second inner surface 127b of each second pad 124b opposite to the second outer surface 125b is exposed by the insulation layer 160d to serve for being connected with an external circuit (not shown). Likewise, referring to FIG. 5, an insulation layer 160e, besides further covering the second outer surface 125b of each second pad 124b of the second circuit board 120b, is further disposed on a first outer surface 115b of each first pad 114b and covers the first outer surface 115b of each first pad 114b.

It should be noted that in other embodiments that are not shown, persons skilled in the art may plan and serve the west region of the circuit board as another small circuit based on actual demands with reference to the description with respect to the embodiments above, thereby mitigating the waste material issue of the circuit, so as to achieve the preferable economic efficiency.

Based on the above, the circuit board structure of the invention has the first circuit board and the second circuit board that are electrically independent from each other, and the second circuit board is disposed inside the first opening of the first circuit board. Namely, in the invention, the waste region (i.e., the first opening) of the first circuit board is sufficiently utilized and planned to serve as the second circuit board. In the circuit board structure of the invention, the generation of waste materials and the product material cost, and the first circuit board can be sufficiently utilized to achieve the preferable economic efficiency.

Although the invention has been disclosed by the above embodiments, they are not intended to limit the invention. It will be apparent to one of ordinary skill in the art that modifications and variations to the invention may be made without departing from the spirit and scope of the invention. Therefore, the scope of the invention will be defined by the appended claims.

What is claimed is:

1. A circuit board structure, comprising:
   a first circuit board, having a first opening;
   a second circuit board, disposed inside the first opening of the first circuit board, and the first circuit board and the second circuit board being electrically independent from each other;
   a plurality of first connection portions, connected to the first circuit board and the second circuit board;
   a mainboard, having a second opening, and the first circuit board and the second circuit board being disposed inside the second opening; and
   a plurality of second connection portions, connected to the mainboard and the first circuit board, wherein the first circuit board comprises a plurality of first pads separated from one another, the second circuit board comprises a plurality of second pads separated from one another, the first pads are located on a first side surface of the first circuit board relatively far away from the second circuit board, and the second pads are located on a second side surface of the second circuit board relatively adjacent to the first circuit board,
   wherein the first connection portions and the second pads are misaligned, and the second connection portions and the first pads are misaligned.

2. The circuit board structure as recited in claim 1, wherein contour outlines of the first circuit board and the second circuit board comprise a circular or a polygon shape.

3. The circuit board structure as recited in claim 1, wherein the mainboard, the first circuit board and the second circuit board are located on a same plane.

4. The circuit board structure as recited in claim 1, wherein the first circuit board further comprises a plurality of first lines, the second circuit board further comprises a plurality of second lines, the first lines are connected to part of the first pads, and the second lines are connected to part of the second pads.

5. The circuit board structure as recited in claim 4, further comprising:
   an insulation layer, at least disposed on the first circuit board, the second circuit board and the first connection portions, wherein the insulation layer at least covers the first lines, the second lines and the first connection portions and exposes the first pads and the second pads.

6. The circuit board structure as recited in claim 5, wherein the insulation layer further covers a first outer surface of each of the first pads.

7. The circuit board structure as recited in claim 6, wherein the insulation layer further covers a second outer surface of each of the second pads.

* * * * *